United States Patent
Adachi

(10) Patent No.: US 7,705,679 B2
(45) Date of Patent: Apr. 27, 2010

(54) OPERATIONAL AMPLIFIER

(75) Inventor: Koichiro Adachi, Ikeda (JP)

(73) Assignee: Ricoh Company, Ltd. (JP)

( * ) Notice: Subject to any disclaimer, the term of this patent is extended or adjusted under 35 U.S.C. 154(b) by 2 days.

(21) Appl. No.: 12/251,483

(22) Filed: Oct. 15, 2008

(65) Prior Publication Data

US 2009/0102558 A1    Apr. 23, 2009

(30) Foreign Application Priority Data

Oct. 23, 2007    (JP) .............................. 2007-275267

(51) Int. Cl.
*H03F 3/45*    (2006.01)
(52) U.S. Cl. .......................................... 330/255; 330/9
(58) Field of Classification Search ......... 330/252–261, 330/9
See application file for complete search history.

(56) References Cited

U.S. PATENT DOCUMENTS 7,495,512 B2 * 2/2009 Tsuchi ........................ 330/260

FOREIGN PATENT DOCUMENTS

JP    2007-116497    5/2007
JP    2007-267016    10/2007

* cited by examiner

*Primary Examiner*—Robert Pascal
*Assistant Examiner*—Hieu P Nguyen
(74) *Attorney, Agent, or Firm*—Dickstein Shapiro LLP

(57) ABSTRACT

An operational amplifier includes a first differential stage, a second differential stage, a second cascade amplifier stage, an output unit, a first switching control unit and a second switching control unit. When an external signal for stopping operation is input, the first switching control unit shuts off a connection between a non-inverting input terminal and a control electrode of one input transistor at each first and second differential stage, and shuts off a connection between an inverting input terminal and a control electrode of another input transistor at the first and second differential stages, and the second switching control unit connects the negative-side power supply voltage terminal to each control gate of the input transistors at the first and second differential stages and to the substrate gates of the input transistors at the first differential stage.

6 Claims, 5 Drawing Sheets

OPERATIONAL AMPLIFIER

CROSS-REFERENCE TO RELATED APPLICATIONS

This patent specification is based on and claims priority from Japanese Patent Application No. 2007-275267, filed on Oct. 23, 2007 in the Japan Patent Office, the entire contents of which are hereby incorporated by reference herein.

BACKGROUND

1. Field of the Invention

The present invention relates to an operational amplifier used in portable devices, such as mobile phones, digital cameras, and so on, and more specifically, to an operational amplifier capable of operating at low voltage.

2. Description of the Related Art

Recently, there is increasing demand for portable devices, such as mobile phones, digital cameras, and so on that are capable of low-voltage operation with low power consumption. For such devices, it is extremely important to have a high-performance operational amplifier capable of operating under such low-power voltage conditions. Such an operational amplifier may be formed of a rail-to-rail-input folded-cascade-type AB-class operational amplifier to achieve stable operation under low-power voltage conditions.

FIG. 1 is a circuit diagram of a rail-to-rail-input folded-cascade-type AB-class operational amplifier 100. The operational amplifier 100 includes a PMOS (P-type Metal Oxide Semiconductor) transistor input unit 101, an NMOS (N-type Metal Oxide Semiconductor) transistor input unit 102, a PMOS transistor cascade amplifier unit 103, an NMOS transistor cascade amplifier unit 104, and an output unit 105.

The PMOS transistor input unit 101 includes a bias current MOS transistor M101 and a pair of PMOS transistors M102 and M103. The PMOS transistors M102 and M103 form a differential pair. A predetermined bias voltage bias1 is input to a gate of the bias current MOS transistor M101 so that a current source is formed.

The NMOS transistor input unit 102 includes a bias current MOS transistor M104 and a pair of NMOS transistors M105 and M106. The NMOS transistors M105 and M106 form a differential pair. A predetermined bias voltage bias2 is input to a gate of the bias current MOS transistor M104 so that a current source is formed.

The PMOS transistor cascade amplifier unit 103 includes load current source MOS transistors M107 and M108, and gate-grounded MOS (ggMOS) transistors M109 and M110. A predetermined bias voltage bias3 is input to the gate of each of the load current source MOS transistors M107 and M108 so that current sources are formed. Further, a predetermined bias voltage bias4 is input to the gate of each of the ggMOS transistors M109 and M110 so that the load current source MOS transistors M107 and M108 operate in each saturation region.

The NMOS transistor cascade amplifier unit 104 includes load current source MOS transistors M115 and M116, and gate-grounded MOS (ggMOS) transistors M113 and M114. A predetermined bias voltage bias7 is input to the gate of each of the ggMOS transistors M113 and M114 so that the load current source MOS transistors M115 and M116 operate in each saturation region.

The output unit 105 includes an NMOS transistor N111 and a PMOS transistor M112 in an input stage, and further includes a PMOS transistor M117 and an NMOS transistor N118 in an output stage.

The operational amplifier 100 operates as an AB-class operational amplifier by inputting a predetermined bias voltage bias5 to a gate of the NMOS transistor N111 and a predetermined bias voltage bias6 to a gate of the PMOS transistor N112. In the AB-class operational amplifier, the PMOS transistor M117 and the NMOS transistor N118 each operate in a stable state.

To reduce output noise, transistors which may contribute noise generation are formed of low-voltage transistors, each of which has high transconductance gm. In FIG. 1, the PMOS transistors M102, M103, M107 and M108 and the NMOS transistors M105, M106, M115 and M116 are formed of low-voltage transistors.

FIG. 2 is a circuit diagram of the operational amplifier 100 when such transistors in FIG. 1 are replaced by low-voltage transistors. In FIG. 2, NMOS transistors M119 and M120, and PMOS transistors M102 are employed to protect the low-voltage transistors under normal operating conditions.

FIG. 3 is an equivalent circuit diagram of the operational amplifier 100 when such AB-class operational amplifier operates in a sleep mode. As shown in FIG. 3, in sleep mode, each gate of the PMOS transistors M101, M107, M108, M110 and M117 is connected to power supply voltage VDD, and each gate of the NMOS transistors M104, M113, M114, and M118 is connected to ground voltage GND. Under these conditions, each node of sources of the PMOS transistors M102 and M103, drains of the NMOS transistors M105 and M106, and a drain of the PMOS M107 attains a high impedance. Accordingly, a high voltage may be applied to these nodes. When the high voltage exceeds a maximum breakdown voltage of each MOS transistor, failure such as destruction of the MOS transistors may occur.

SUMMARY

This patent specification describes a novel operational amplifier that includes a first differential stage, a second differential stage, a second cascade amplifier stage, an output unit, a first switching control unit and a second switching control unit. When an external signal for stopping operation is input, the first switching control unit shuts off a connection between a non-inverting input terminal and a control electrode of one input transistor at each first and second differential stage, and shuts off a connection between an inverting input terminal and a control electrode of another input transistor at the first and second differential stages, and the second switching control unit connects the negative-side power supply voltage terminal to each control gate of the input transistors at the first and second differential stages and to the substrate gates of the input transistors at the first differential stage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF ILLUSTRATIVE EMBODIMENTS

Figure 1:
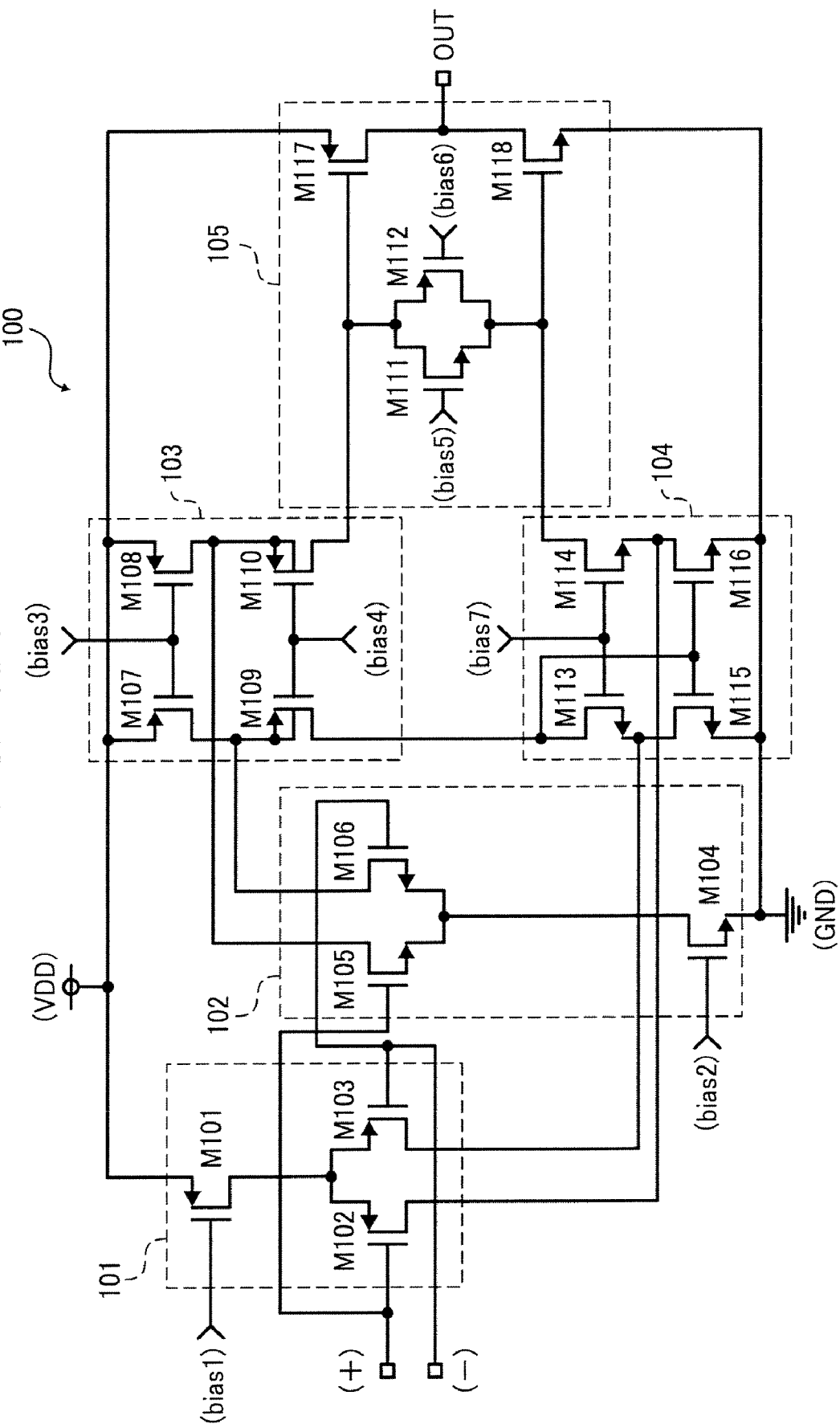
FIG. 1 is a circuit diagram of a rail-to-rail-input folded-cascade-type AB-class operational amplifier.
Figure 2:
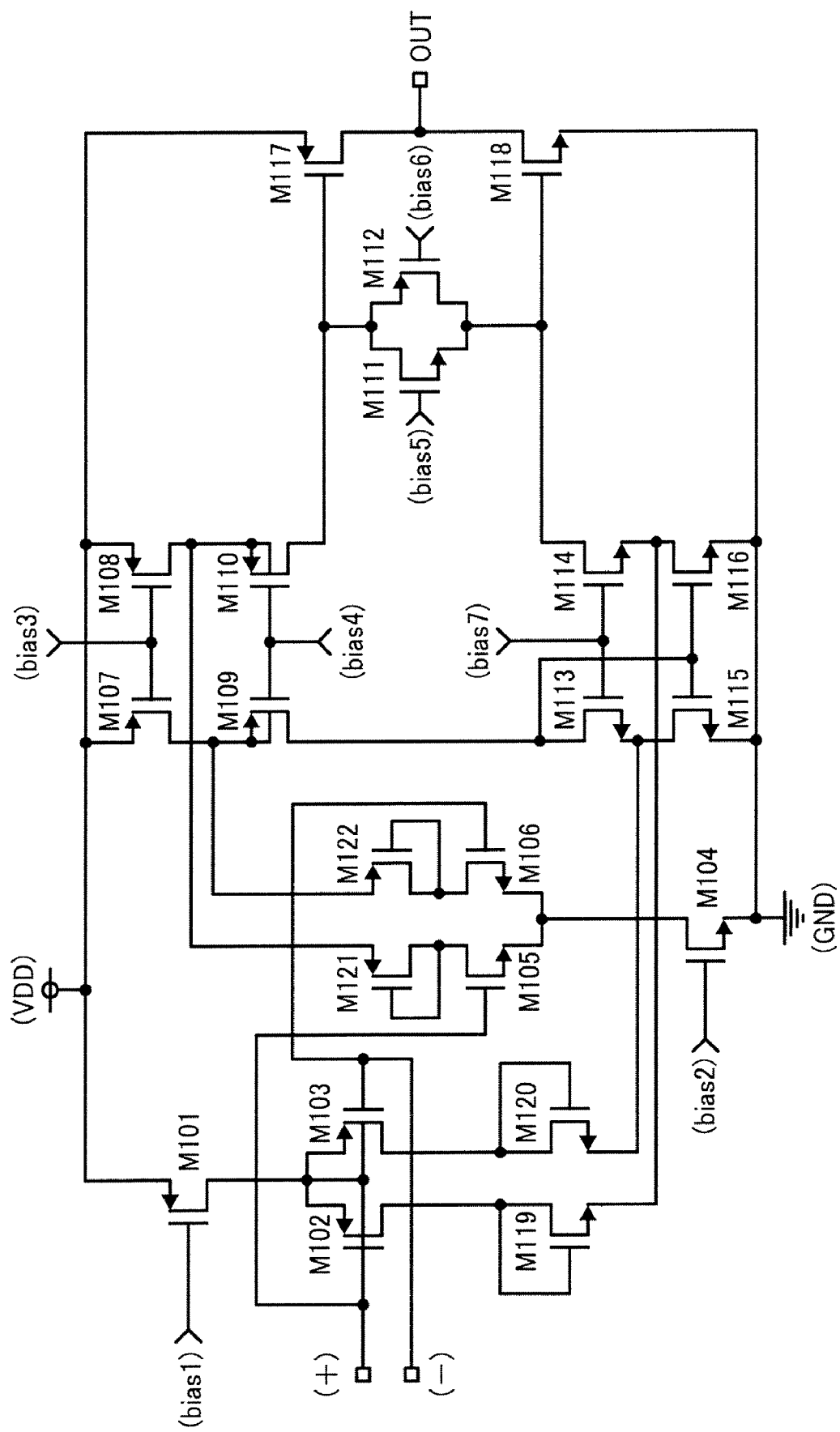
FIG. 2 is a circuit diagram of the operational amplifier when such transistors in FIG. 1 are replaced by low-voltage transistors.
Figure 3:
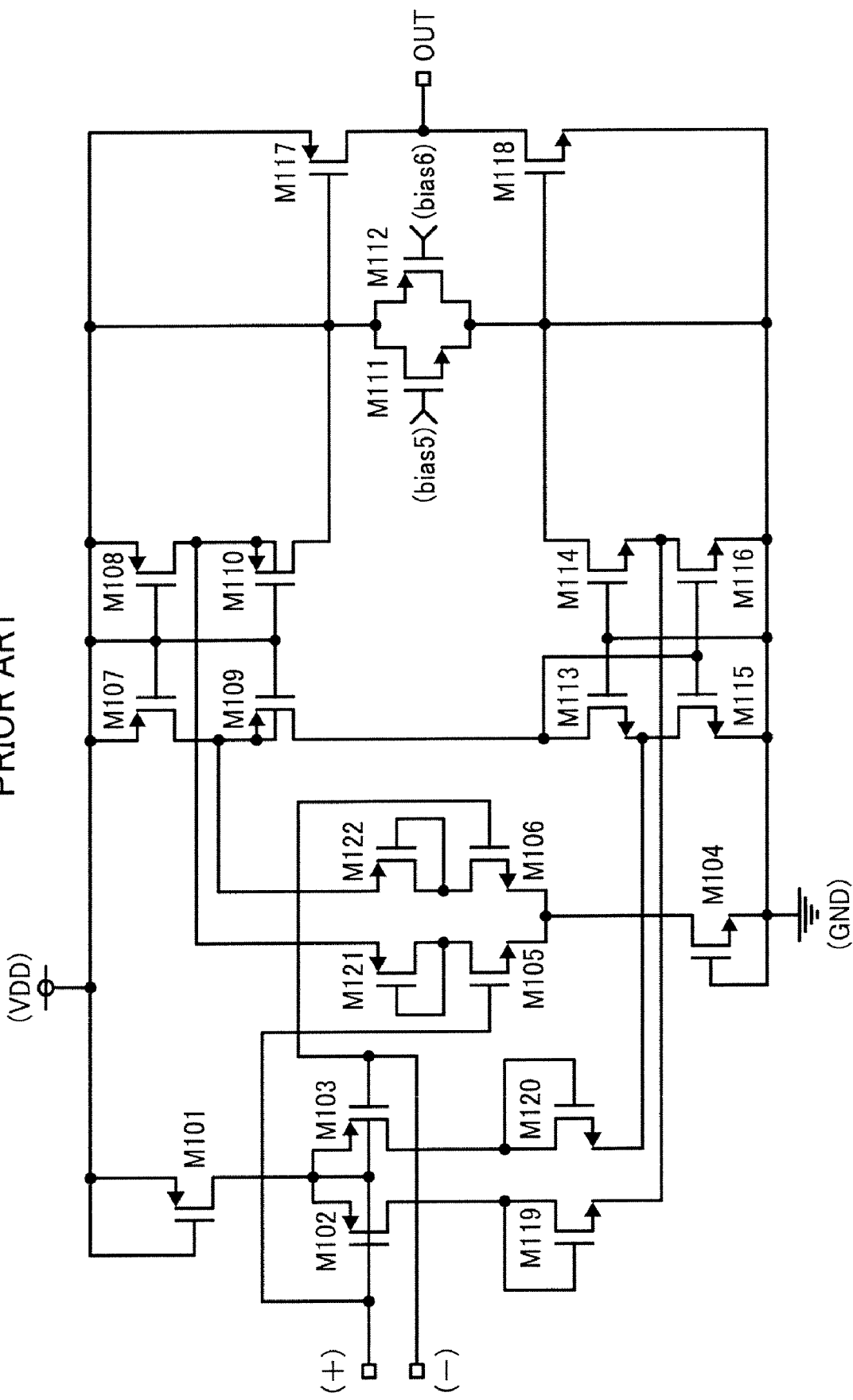
FIG. 3 is an equivalent circuit diagram of the operational amplifier when such AB class operational amplifier operates in a sleep mode.

In describing illustrative embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 4:
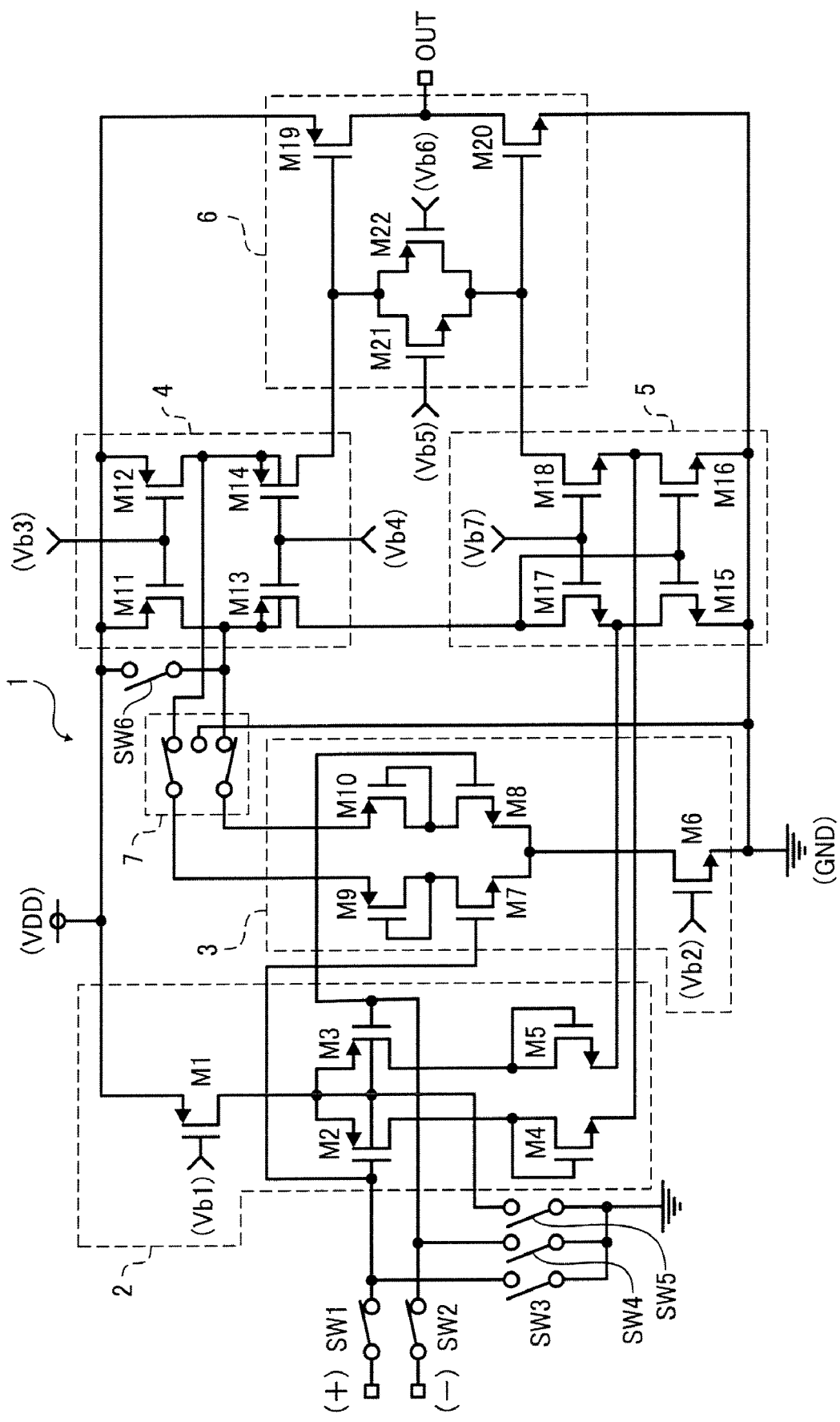
FIG. 4 is a circuit diagram of an operational amplifier according to an illustrative embodiment.

Referring now to the drawings, wherein like reference numerals designate identical or corresponding parts throughout the several views thereof, and in the first instance to FIG. 4, an operational amplifier according to illustrative embodiments of the present invention is described.

FIG. 4 is a circuit diagram of an operational amplifier 1 according to an illustrative embodiment. In FIG. 4, the operational amplifier 1 is a rail-to-rail-input folded-cascade-type AB-class operational amplifier. With this operational amplifier 1, a voltage-follower connection circuit can be formed by inputting an output signal from an output terminal to an inverting input terminal and connecting a non-inverting input terminal to ground. Further, an inverting-input connection circuit can be formed by connecting a resistor between the inverting in put terminal and the output terminal. In this case, it is preferable that the ground voltage GND be determined within a common mode voltage range that is an allowable input voltage range so as to achieve a high-gain operational amplifier.

The operational amplifier 1 includes a PMOS transistor input unit 2, an NMOS transistor input unit 3, a PMOS transistor cascade amplifier unit 4, an NMOS transistor cascade amplifier unit 5, an output unit 6, a switching unit 7, and switches SW1 through SW6. The PMOS transistor input unit 2 forms a first differential stage, the NMOS transistor input unit 3 forms a second differential stage, the PMOS transistor cascade amplifier unit 4 forms a second cascade amplifier stage, and the NMOS transistor cascade amplifier unit 5 forms a first cascade amplifier stage. The switches SW1 and SW2 form a first switching control unit, the switches SW3, SW4 and SW5 form a second switching control unit, and the switch SW6 forms a third switching control unit.

The PMOS transistor input unit 2 includes PMOS transistors M1, M2 and M3, NMOS transistors M4 and M5. A bias voltage Vb1 is input to a gate of the PMOS transistor M1 so that a current source is formed. The PMOS transistors M2 and M3 form a differential pair. Each source of the PMOS transistors M2 and M3 is connected in common. The PMOS transistor M1 is connected between a junction node between the sources of the PMOS transistors M2 and M3 and a power supply terminal. One end of the switch SW1 is connected to a gate of the PMOS transistor M2, and another end of the switch SW1 forms the non-inverting input terminal.

Further, one end of the switch SW2 is connected to a gate of the PMOS transistor M3, and another end of the switch SW2 forms the inverting input terminal. The gate of the PMOS transistor M2 is connected to ground through the switch SW3, and the gate of the PMOS transistor M3 is connected to ground through the switch SW4. Each substrate gate of the PMOS transistors M2 and M3 is connected in common. A junction node of the substrate gates of the PMOS transistors M2 and M3 is connected to a junction node of sources of the PMOS transistors M2 and M3, and is connected to ground through the switch SW5. A drain of the PMOS transistor M2 is connected to a drain of the NMOS transistor M4. A gate of the NMOS transistor M4 is connected to a junction node between the drain of the PMOS transistor M2 and the drain of the NMOS transistor M4. A drain of the PMOS transistor M3 is connected to a drain of the NMOS transistor M5. A gate of the NMOS transistor M5 is connected to a junction node between the drain of the PMOS transistor M3 and the drain of the NMOS transistor M5.

The NMOS transistor input unit 3 includes NMOS transistors M6, M7, and M8, and PMOS transistors M9 and M10. A bias voltage Vb2 is input to a gate of the PMOS transistor M6 so that a current source is formed. The NMOS transistors M7 and M8 form a differential pair. Each source of the NMOS transistors M7 and M8 is connected in common. The NMOS transistor M6 is connected between ground and a junction node of the sources of the NMOS transistors M7 and M8. A gate of the NMOS transistor M7 is connected to the gate of the PMOS transistor M2, and a gate of the NMOS transistor M8 is connected to the gate of the PMOS transistor M3. A drain of the NMOS transistor M7 is connected to a drain of the PMOS transistor M9. A gate of the PMOS transistor M9 is connected to a junction node between the drain of the NMOS transistor M7 and the drain of the PMOS transistor M9. A drain of the NMOS transistor M8 is connected to a drain of the PMOS transistor M10. A gate of the PMOS transistor M10 is connected to a junction node between the drain of the NMOS transistor M8 and the drain of the PMOS transistor M10. Each source of the PMOS transistors M9 and M10 is connected to the switching unit 7.

The PMOS transistor cascade amplifier unit 4 includes PMOS transistors M11, M12, M13, and M14, and each source of the PMOS transistors M11 and M12 is connected to the power supply terminal. A predetermined bias voltage Vb3 is input to each gate of the PMOS transistors M11 and M12 so that a current source is formed. A drain of the PMOS transistor M11 is connected to a drain of the PMOS transistor M13, and a junction node thereof is connected to the switching unit 7. Similarly, a drain of the PMOS transistor M12 is connected to a drain of the PMOS transistor M14, and a junction node thereof is connected to the switching unit 7. A predetermined bias voltage Vb4 is input to each gate of the PMOS transistors M13 and M14 so that the PMOS transistors M11 and M12 operate in each saturation region. The switch SW6 is connected in parallel with the PMOS transistor M11.

The NMOS transistor cascade amplifier unit 5 includes NMOS transistors M15, M16, M17, and M18, and each source of the NMOS transistors M15 and M16 is connected to ground. Each gate of the NMOS transistors M15 and M16 is connected in common, and a junction node therebetween is connected to a drain of the NMOS transistor M17. A drain of the NMOS transistor M15 is connected to a source of the NMOS transistor M17, and a junction node therebetween is connected to a source of the NMOS transistor M5.

Similarly, a drain of the NMOS transistor M16 is connected to a source of the NMOS transistor M18, and a junction node therebetween is connected to the source of the NMOS transistor M4. A drain of the NMOS transistor M17 is connected to a drain of the PMOS transistor M13. A predetermined bias voltage Vb7 is input to each gate of the NMOS transistors M17 and M18 so that the NMOS transistors M15 and M16 operate in each saturation region.

The output unit 6 includes PMOS transistors M19 and M22, and NMOS transistors M20 and M21. The PMOS transistor M19 and the NMOS transistor M20 are connected in serial between power supply voltage terminal and ground. A gate of the PMOS transistor M19 is connected to a drain of the PMOS transistor M14, and a gate of the NMOS transistor M20 is connected to a drain of the NMOS transistor M18. The NMOS transistor M21 and the PMOS transistor M22 are connected in parallel between the gate of the PMOS transistor M19 and the gate of the NMOS transistor M20. A bias voltage Vb5 is input to a gate of the NMOS transistor M21 and a bias voltage Vb6 is input to a gate of the PMOS transistor M22. A junction node between the PMOS transistor M19 and the NMOS transistor M20 is the output terminal OUT of the operational amplifier 1. In this operational amplifier 1, current values of the PMOS transistor M19 and the NMOS transistor M20 in a steady state are determined by the bias voltages Vb5 and Vb6.

In this circuit configuration, the PMOS transistors M2, M3, M11, and M12 and NMOS transistors M7, M8, M15 and M16 are formed of low-voltage transistors. The NMOS transistors M4 and M5 and PMOS transistors M9 and M10 are employed to protect these low-voltage transistors under normal operating conditions.

Under normal operating conditions, the switches SW1 and SW2 are turned on to create a conduction state in accordance with an external control signal, not shown. Further, the switches SW3, SW4, SW5 and SW6 are turned off to create a shutdown state. The switching unit 7 connects a source of the PMOS transistor M9 to a junction node between the PMOS transistors M12 and M14, and connects a source of the PMOS transistor M10 to a junction node between the PMOS transistors M11 and M13.

Under these conditions, when an input voltage input to the non-inverting input terminal and/or the inverting input terminal is relatively small, the PMOS transistor input unit 2 starts operation and the NMOS transistor input unit 3 stops operation. Output signals from the PMOS transistor input unit 2 are input to the NMOS transistor cascade amplifier unit 5, amplified by the PMOS transistor cascade amplifier unit 4 and the NMOS transistor cascade amplifier unit 5, and output to the output unit 6. Signals input to the output unit 6 are further amplified by the PMOS transistor M19 of the output unit 6, and an amplified signal is output from the output terminal OUT.

By contrast, when the input voltage input to the non-inverting input terminal and/or the inverting input terminal is relatively large, the PMOS transistor input unit 2 stops operation and the NMOS transistor input unit 3 starts operation. Output signals from the NMOS transistor input unit 3 are input to the PMOS transistor cascade amplifier unit 4, amplified by the PMOS transistor cascade amplifier unit 4 and the NMOS transistor cascade amplifier unit 5, and an amplified signal is output to the output unit 6. Signals input to the output unit 6 are further amplified by the NMOS transistor M20 of the output unit 6, and an amplified signal is output from the output terminal OUT.

Figure 5:
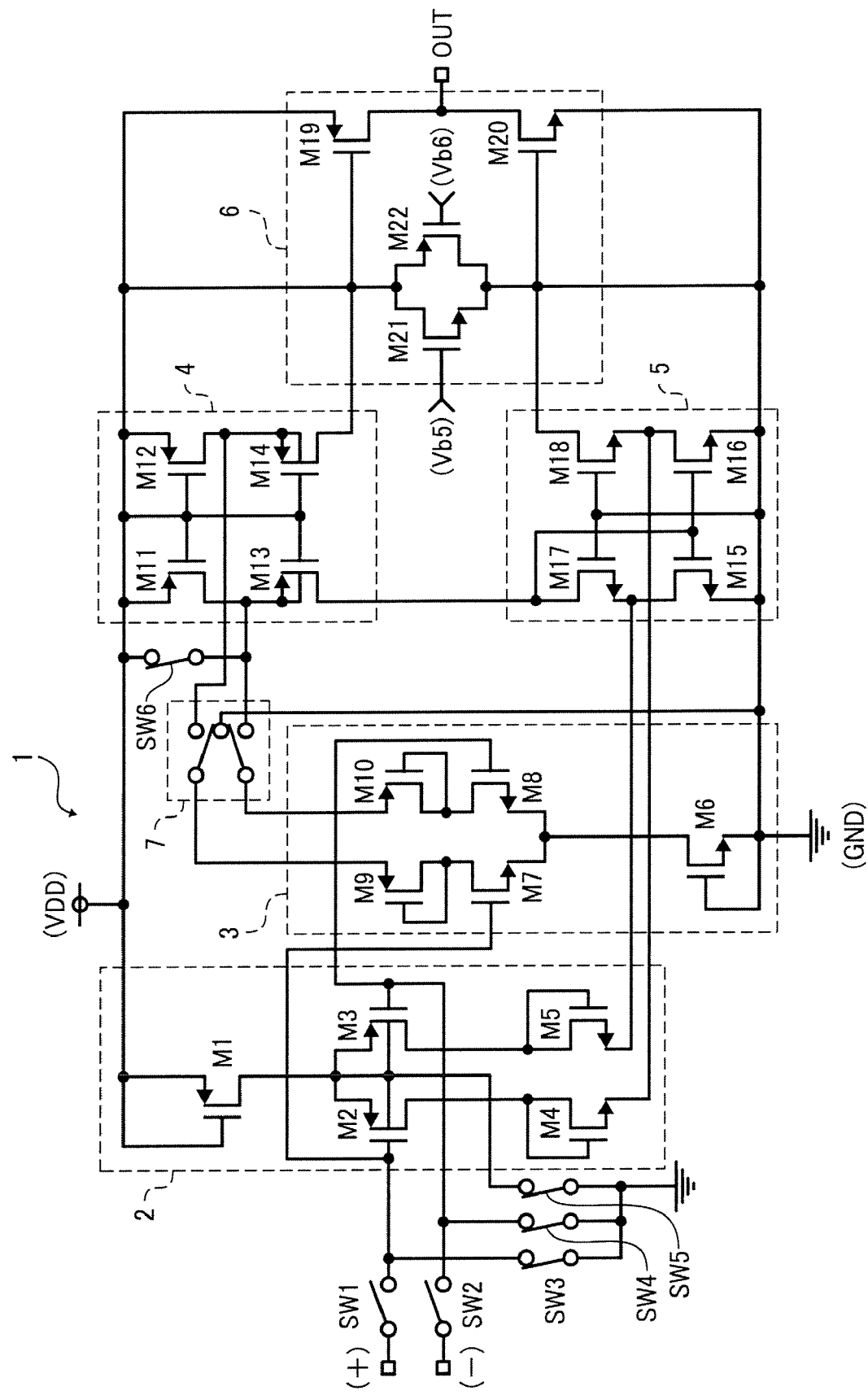
FIG. 5 is a circuit diagram of an operational amplifier of FIG. 4 in a sleep mode condition.

When the operational amplifier 1 operates in a sleep mode, the circuit diagram of the operational amplifier 1 of FIG. 4 can be expressed by an equivalent circuit diagram shown in FIG. 5.

In FIG. 5, each gate of the PMOS transistors M1, M11, M12, M13, M14, and M19 is connected to the power supply terminal. Each gate of the PMOS transistors M6, M17, M18, and M20 is connected to ground so as to prevent current flow. Further, the switches SW1 and SW2 are turned off to create a shutdown state so as to shut off a connection with an external device through the non-inverting input terminal and/or the inverting input terminal in accordance with the external control signal. Further, each gate of the PMOS transistors M2 and M3 and the NMOS transistors M7 and M8 Is connected to ground by turning on the switches SW3 and SW4 to create a conduction state.

Further, each source and each substrate gate of the PMOS transistors M2 and M3 is connected to ground by turning on the switch SW5. As a result, it becomes possible to prevent a high voltage which may exceed the maximum breakdown voltage of the PMOS transistors M2 and M3 from being applied.

As described above, the operational amplifier 1 according to the illustrative embodiment performs in the following ways in the sleep mode. First, the connection to the external device through the non-inverting input terminal and/or the inverting input terminal is shut off. Each gate of the PMOS transistors M2 and M3 and the NMOS transistors M7 and M8 is connected to ground. Each source and each substrate gate of the PMOS transistors M2 and M3 is connected to ground. Each source of the PMOS transistors M9 and M10 and each drain of the NMOS transistors M7 and M8 is connected to ground. A drain of the PMOS transistors M11 is connected to the power supply terminal. As a result, even if low-voltage transistors are employed to reduce output noise, it is possible to prevent a high voltage which may exceed the breakdown voltage of the low-voltage transistors from being generated.

In the illustrative embodiment, a rail-to-rail-input folded-cascade-type AB-class operational amplifier is described. However, the concept of this disclosure can be applied to any other folded-cascade-type operational amplifier that employs low-voltage transistors for each input MOS transistor and each source-grounded transistor of the cascade operational amplifier.

Numerous additional modifications and variations are possible in light of the above teachings. It is therefore to be understood, that within the scope of the appended claims, the disclosure of this patent specification may be practiced otherwise than as specifically described herein.

What is claimed is:

1. An operational amplifier comprising:
a first differential stage having a differential pair formed of PMOS transistors;
a second differential stage having a differential pair formed of NMOS transistors;
a first cascade amplifier stage provided to correspond to the first differential stage;
a second cascade amplifier stage provided to correspond to the second differential stage;
an output unit configured to generate and output signals in accordance with each output signal from the corresponding cascade amplifier stage;
a first switching control unit configured to switch between a non-inverting input terminal and a control electrode of one input transistor at each first and second differential stage, and switch between an inverting input terminal and a control electrode of another input transistor at the first and second differential stages; and
a second switching control unit configured to switch between a negative-side power supply voltage terminal and each control gate of the input transistors at the first and second differential stages, and switch between the negative-side power supply voltage terminal and substrate gates of the input transistors at the first differential stage,
wherein, when an external signal for stopping operation is input, the first switching control unit shuts off a connection between the non-inverting input terminal and the control electrode of one input transistor at each first and second differential stage, and shuts off a connection between the inverting input terminal and a control electrode of another input transistor at the first and second differential stages, and the second switching control unit connects the negative-side power supply voltage terminal to each control gate of the input transistors at the first and second differential stages and to the substrate gates of the input transistors at the first differential stage.

2. The operational amplifier according to claim 1, further comprising:
a switching unit configured to switch between the second differential stage and the second cascade amplifier stage,
wherein, when an external signal for stopping operation is input, the switching unit shuts off connections between the second differential stage and the second cascade amplifier stage, and connects output nodes of the second differential stage to the negative-side power supply voltage terminal.

3. The operational amplifier according to claim 1, wherein the second cascade amplifier stage comprises:
PMOS transistors connected between each input transistor at the second differential stage and a positive-side power supply voltage terminal to form load transistors for the input transistors at the second differential stage; and
a third switching control unit,
wherein, when an external signal for stopping operation is input, the third switching control unit connects a drain and a source of the PMOS transistor to fix respective voltages thereof at the positive-side power supply voltage.

4. A switching control method for an operational amplifier, the operational amplifier comprising:
a first differential stage having a differential pair formed of PMOS transistors;
a second differential stage having a differential pair formed of NMOS transistors;
a first cascade amplifier stage provided to correspond to the first differential stage;
a second cascade amplifier stage provided to correspond to the second differential stage;
an output unit configured to generate and output signals in accordance with each output signal from the corresponding cascade amplifier stage;
a first switching control unit configured to switch between a non-inverting input terminal and a control electrode of one input transistor at each first and second differential stage, and switch between an inverting input terminal and a control electrode of another input transistor at the first and second differential stages; and
a second switching control unit configured to switch between a negative-side power supply voltage terminal and each control gate of the input transistors at the first and second differential stages, and switch between the negative-side power supply voltage terminal and substrate gates of the input transistors at the first differential stage,
the switching control method comprising:
(a) when an external signal for stopping operation is input, shutting off a connection between the non-inverting input terminal and the control electrode of one input transistor at each first and second differential stage with the first switching control unit;
(b) shutting off a connection between the inverting input terminal and a control electrode of another input transistor at the first and second differential stages with the first switching control unit; and
(c) connecting the negative-side power supply voltage terminal to each control gate of the input transistors at the first and second differential stages and to the substrate gates of the input transistors at the first differential stage with the second switching control unit.

5. The switching control method according to claim 4, wherein the operational amplifier further comprises a switching unit configured to switch between the second differential stage and the second cascade amplifier stage,
the switching control method further comprising shutting off connections between the second differential stage and the second cascade amplifier stage and connecting output nodes of the second differential stage to the negative-side power supply voltage terminal with the switching unit hen an external signal for stopping operation is input.

6. The switching control method according to claim 4, wherein the second cascade amplifier stage of the operational amplifier further comprises PMOS transistors connected between each input transistor at the second differential stage and a positive-side power supply voltage terminal to form load transistors for the input transistors at the second differential stage and a third switching control unit,
the switching control method further comprising connecting a drain and a source of the PMOS transistor to fix respective voltages thereof at the positive-side power supply voltage with the third switching control unit when an external signal for stopping operation is input.

* * * * *